United States Patent
Klein et al.

(10) Patent No.: US 9,787,313 B1
(45) Date of Patent: Oct. 10, 2017

(54) PRECISION PULSE GENERATION USING A SERIAL TRANSCEIVER

(71) Applicant: Xilinx, Inc., San Jose, CA (US)

(72) Inventors: Matthew H. Klein, Redwood City, CA (US); David F. Taylor, Edinburgh (GB)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/159,155

(22) Filed: May 19, 2016

(51) Int. Cl.
*G04C 21/28* (2006.01)
*H03L 7/06* (2006.01)
*H03K 5/135* (2006.01)
*H03M 9/00* (2006.01)
*H03K 5/00* (2006.01)

(52) U.S. Cl.
CPC ............... *H03L 7/06* (2013.01); *H03K 5/135* (2013.01); *H03M 9/00* (2013.01); *H03K 2005/00052* (2013.01)

(58) Field of Classification Search
CPC .......................................................... H03L 7/06
See application file for complete search history.

(56) References Cited

U.S. PATENT DOCUMENTS

| 8,665,928 | B1 | 3/2014 | Klein et al. |
| 8,874,999 | B1 | 10/2014 | Taylor et al. |
| 2014/0118040 | A1* | 5/2014 | Nakayama ............ H03L 7/0816 327/157 |

* cited by examiner

*Primary Examiner* — Daniel Puentes
(74) *Attorney, Agent, or Firm* — Robert M. Brush

(57) ABSTRACT

An example pulse generation circuit includes a parallel-to-serial circuit configured to convert parallel data to serial data according to parallel clock signal and a serial clock signal, the serial data comprises a sequence of pulses; a clock generator configured to generate a clock signal; and a phase controller configured to generate the serial clock signal from the clock signal based on a phase control signal.

12 Claims, 6 Drawing Sheets

PRECISION PULSE GENERATION USING A SERIAL TRANSCEIVER

TECHNICAL FIELD

Examples of the present disclosure generally relate to electronic circuits and, in particular, to precision pulse generation using a serial transceiver.

BACKGROUND

Precision generation of pulses or data edges is desirable for various electronic equipment, such as precision instrumentation, radar, and the like. Often times, a high-speed clock is required to obtain high-precision pulses. For example, a stream of pulses with an edge position resolution of 40 picoseconds (ps) requires a 25 gigahertz (GHz) clock. A clock generator for generating such a high speed dock may consume significant power or otherwise may be unavailable. In another example, a stream of pulses with an edge position resolution of 10 ps requires a 100 GHz serial clock. A clock generator for generating such a high speed clock may not be readily available. Thus, there is a need for precision pulse generation without use of a high-speed clock.

SUMMARY

Techniques for precision pulse generation using a serial transceiver are described. In an example, a pulse generation circuit includes a parallel-to-serial circuit configured to convert parallel data to serial data according to parallel clock signal and a serial clock signal, the serial data comprises a sequence of pulses; a clock generator configured to generate a clock signal; and a phase controller configured to generate the serial clock signal from the clock signal based on a phase control signal.

In another example, a method of controlling a parallel-to-serial circuit to generate a sequence of pulses includes selecting a pulse repetition interval and a pulse width. The method further includes configuring a control circuit with a parallel data word sequence to be coupled to the parallel-to-serial circuit based on the selected pulse repetition and pulse width. The method further includes configuring the control circuit with a phase update sequence to adjust a phase controller coupled to the parallel-to-serial circuit based on the selected pulse repetition and pulse width. The method further includes coupling the parallel data word sequence and the phase update sequence from the control circuit to the parallel-to-serial circuit to generate the sequence of pulses.

In another example, a circuit includes a pulse generator configured to generate pulses; and a pulse consumer circuit configured to consume the pulses. The pulse generator includes a parallel-to-serial circuit configured to convert parallel data to serial data according to parallel clock signal and a serial clock signal, the serial data comprising the pulses; a clock generator configured to generate a clock signal; and a phase controller configured to generate the serial clock signal from the clock signal based on a phase control signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
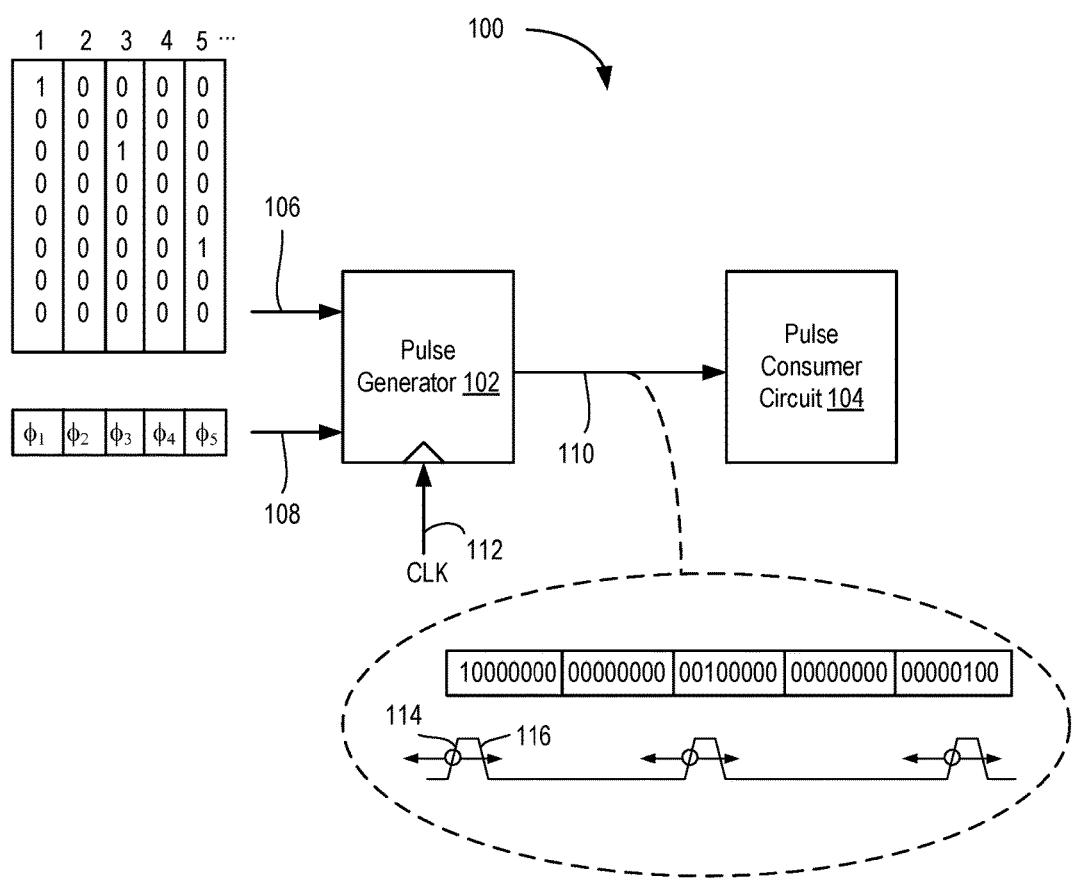
FIG. 1 is a block diagram depicting a system having a pulse generator and a pulse consumer circuit according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for precision pulse generation using a serial transceiver are described. In an example, a pulse generation circuit is configured to convert parallel data to serial data according to a parallel clock and a serial clock. The serial data includes a sequence of pulses, each having at least one precision edge. The pulse generation circuit includes a phase controller, such as a phase interpolator, configured to generate the serial clock from a reference clock based on a phase control signal. The reference clock can be generated by a clock generator, such as a phase locked loop (PLL) or the like. The parallel data provides for coarse control of the precision edges of the pulses. The phase controller provides for fine control of the precision edges of the pulses. The phase controller allows for use of a much lower speed reference clock to obtain a desired resolution of the precision edges. For example, the phase controller can be configured to adjust phase using 64 steps. In such an example, the reference clock can have a frequency 1/64 that of the frequency required without use of the phase controller. Thus, if a 40 ps resolution is required, the reference clock can have a frequency of only 390.25 MHz (e.g., 25 GHz/64) rather than 25 GHz. Accordingly, the pulse generator described herein obviates the need for very high-speed PLLs, which consume significant power or otherwise may be unavailable. These and other advantages are described below with respect to the drawings.

FIG. 1 is a block diagram depicting a system 100 having a pulse generator 102 and a pulse consumer circuit 104 according to an example. The pulse generator 102 includes an input 106 configured to receive parallel data and an input 108 configured to receive fine phase control data. The pulse generator 102 includes an input 112 configured to receive a clock signal ("CLK"). The pulse generator 102 includes an output 110 coupled to an input of the pulse consumer circuit 104. The pulse generator 102 outputs a stream of pulses ("pulse stream") for use by the pulse consumer circuit 104. For example, the pulse consumer circuit 104 can include circuits for radar applications, such as precision radio frequency (RF) envelope generation. In another example, the pulse consumer circuit 104 can include circuits for precision instrumentation applications, such as precision interval generation circuits or precision pulse width generation circuits. Those skilled in the art will appreciate that the pulse generator 102 described herein may find use in various other applications in addition to the specific example applications described herein.

In operation, the pulse generator 102 generates a pulse stream based on the parallel data at the input 106 and the fine phase control data at the input 108 based on the clock signal CLK at the input 112. In an example, the pulse generator 102 performs X:1 serialization to convert the X-bit parallel data at the input 106 to serial data at the output 110. In the example of FIG. 1, the pulse generator 102 X=8 such that the pulse generator 102 performs 8:1 serialization of 8-bit data words. Although 8:1 serialization is described as an example, it is to be understood that other serialization ratios can be used. Further, in some examples, the pulse generator 102 can have a configurable serialization ratio.

The parallel data provides coarse control of pulse edge positions in the serial output data within a resolution of one unit interval (UI) of clock signal CLK at the input 112. Each pulse in the output 110 includes a leading edge 114 and a trailing edge 116. In the example shown, the pulses are logic high pulses, but in other examples the pulses can be logic low pulses. In an example, one of the edges 114, 116 is a precision edge and the other of the edges 114, 116 is the non-precision edge. The non-precision edge transitions K UI after the precision edge, where K is an integer greater than zero. That is, each pulse has a configurable pulse width of K UI. In the example shown, the leading edge 114 is the precision edge. In other examples, the trailing edge 116 can be the precision edge. In another example, both edges 114, 116 can be precision edges.

Each logic "1" in the parallel data results in a pulse in the serial data. Logic 1's can be position in the parallel data words in order to coarsely adjust the interval between the precision edges of the pulses in the serial data within a resolution of one UI. In an example, the parallel data includes at most two logic transitions per data word including between data words. The position of the precision edges of the pulses in the serial output data are further refined based on the fine phase control data on the input 108. As described further below, the fine phase control data can move a given precision edge a fraction of a UI of the clock signal CLK at the input 112. Operation of the fine phase control can be further understood with reference to FIG. 2.

Figure 2:
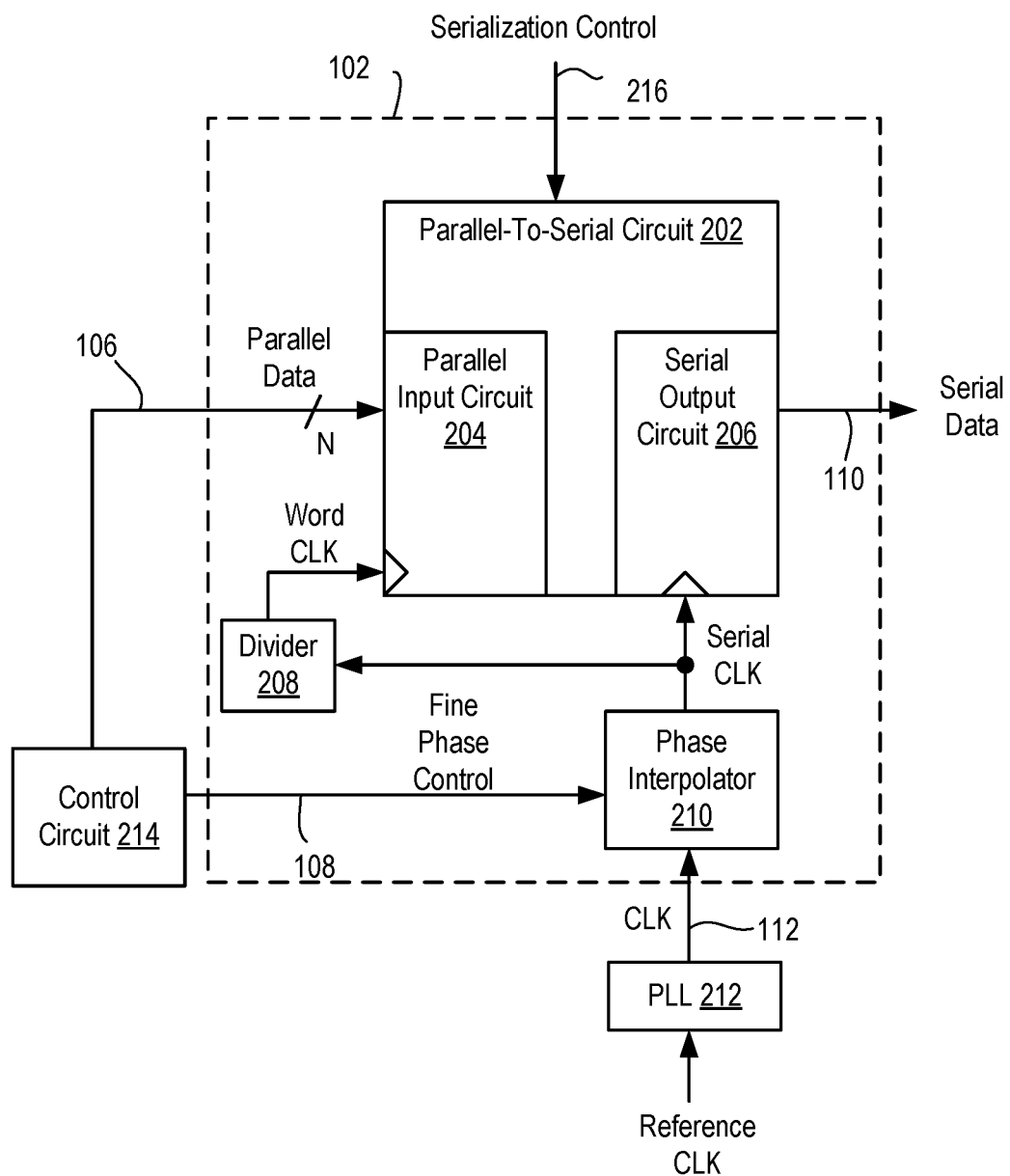
FIG. 2 is a block diagram depicting a pulse generator according to an example.

FIG. 2 is a block diagram depicting the pulse generator 102 according to an example. The pulse generator 102 includes a parallel-to-serial circuit 202, a divider 208, and a phase interpolator 210. The pulse generator 102 can be coupled to a phase-locked loop (PLL) 212 and a control circuit 214. The parallel-to-serial circuit 202 includes a parallel input circuit 204 and a serial output circuit 206. The serial output circuit 206 generates the serial output data on the output 110 according to a serial clock ("serial CLK"). The serial clock signal is output by the phase interpolator 210. The parallel input circuit 204 receives the parallel data on the input 106. The parallel-to-serial circuit 202 serializes the parallel data received by the parallel input circuit 204 to generate the serial output data provided by the serial output circuit 206. The parallel input circuit 204 processes words of the parallel data according to a word clock signal ("word CLK"). The divider 208 generates the word clock signal by dividing the serial clock signal by the number of bits per word (denoted as N).

The parallel-to-serial circuit 202 can include an input 216 for serialization control. In an example, the parallel-to-serial circuit 202 can employ different serialization rates by adjusting the input 216. The serialization rate can be controlled by another circuit or by the control circuit 214.

The phase interpolator 210 receives the clock signal CLK from the PLL 212. The PLL 212 generates the clocks signal CLK from a reference clock signal ("reference CLK"). The PLL 212 can be any type of clock generator circuit for generating a clock at a particular frequency. The phase interpolator 210 is configured to adjust the phase of the clock signal CLK to produce the serial clock signal. The phase interpolator 210 can adjust the phase by discrete amounts per UI of the serial clock signal. For example, the phase interpolator 210 can select among 64 phase adjustments per UI of the serial clock signal. In other examples, the phase interpolator 210 can select among more than or less than 64 phase adjustments per UI of the serial clock signal. The step size of the phase interpolator 210 can be fixed or variable. In an example where the phase interpolator 210 is capable of 64 phase adjustments per UI of the serial clock signal, the phase interpolator 210 can adjust the phase by Y/64 during a phase adjustment, where Y (step size) is an integer greater than zero. In some examples, Y is fixed. In other examples, Y is variable ranging from a minimum value to a maximum value.

In the examples described herein, the pulse generator 102 includes the phase interpolator 210 for adjusting phase of the clock signal CLK to produce the serial clock signal. It is to be understood that other types of circuits can be used to adjust the phase of the clock signal. In general, the pulse generator 102 includes a phase controller, such as the phase interpolator 210, for adjusting the phase of the clock signal to generate the serial clock signal. Other types of phase controllers include a delay line circuit, a control circuit that provides voltage pulses to a voltage controlled oscillator (VCO) of the PLL 212, a phase offset control circuit for the PLL 212, or the like. In general, the pulse generator 102 includes a phase controller that is configured to generate a serial clock signal having a phase selected from a plurality of selectable phases.

Figure 5:
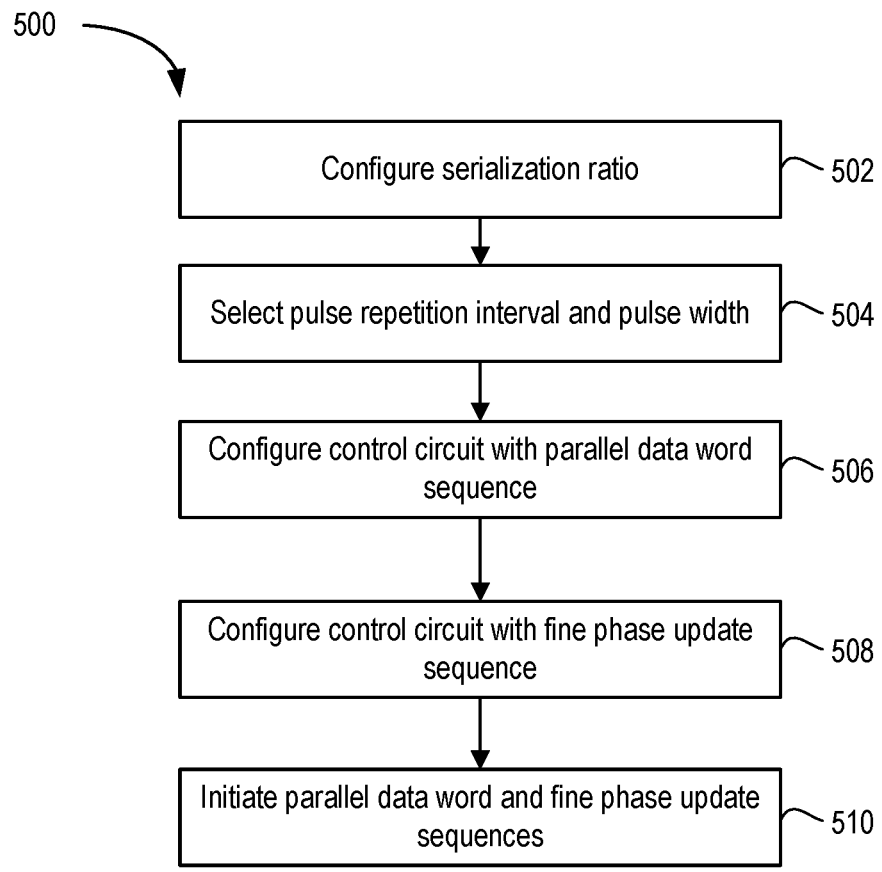
FIG. 5 is a flow diagram depicting a method of controlling a parallel-to-serial circuit for pulse generation according to an example.

The control circuit 214 generates the parallel data on the input 106 for coarse phase control and the fine phase control data on the input 108 for fine phase control. FIG. 5 is a flow diagram depicting a method 500 of controlling a parallel-to-serial circuit for pulse generation according to an example. The method 500 can be at least partially performed by the control circuit 214 or by the control circuit 214 in combination with other control circuitry.

The method 500 begins at step 502, where the serialization ratio is set for the parallel-to-serial circuit 202. For example, the parallel-to-serial circuit 202 can be set to have an 8:1 serialization ratio. At step 504, the pulse width of serial output pulses is selected for the parallel-to-serial circuit 202. Also, at step 504, the pulse repetition rate is selected for the parallel-to-serial circuit 202. For example, the pulse width can be K UI, where K is a positive integer. The pulse repetition rate can be some fractional multiple of the UI of the serial clock. At step 506, the control circuit 214 is configured with a parallel data word sequence. The sequence of data words can be configured to coarsely adjust the phase of the pulses in the serial data. At step 508, the control circuit 214 is configured with a fine phase update sequence. The fine phase update sequence includes a sequence of phase updates that are used to finely adjust the phase of the pulses in the serial data. At step 510, the control circuit 214 is configured to initiate the parallel data word and fine phase update sequences to begin the pulse generation.

Operation of the control circuit 214 and the method 500 can be understood with reference to the following example. In an example, it is desired to have one UI high true pulses every 16.4657 UI, the parallel data words are 8-bits wide (e.g., 8-to-1 serialization), and the phase interpolator 210 operates in steps of $1/64$ UI. The control circuit 214 updates the phase adjustment applied by the phase interpolator 210 before updating the data word containing the pulse edge to be varied. Table 1 below shows values for the data words and fine phase control for the above-described example.

TABLE 1

| Target Pulse Edge (UI) | Word # | Parallel Data Word (Hex) | Parallel Data Word (Binary) | Fine Phase in 1/64 UI |
| --- | --- | --- | --- | --- |
| 0 | 1 | 0 × 80 | 10000000 | No Update |
| — | 2 | 0 × 00 | 00000000 | 30 |
| 16.4657 | 3 | 0 × 80 | 10000000 | No Update |
| — | 4 | 0 × 00 | 00000000 | 60 |
| 32.9314 | 5 | 0 × 40 | 0100000 | No Update |
| — | 6 | 0 × 00 | 0000000 | 25 |
| 49.3971 | 7 | 0 × 40 | 0100000 | No Update |
| — | 8 | 0 × 00 | 0000000 | 55 |
| 65.8628 | 9 | 0 × 20 | 0010000 | No Update |
| — | 10 | 0 × 00 | 0000000 | 21 |
| 82.3285 | 11 | 0 × 20 | 0010000 | No Update |

Figure 3:
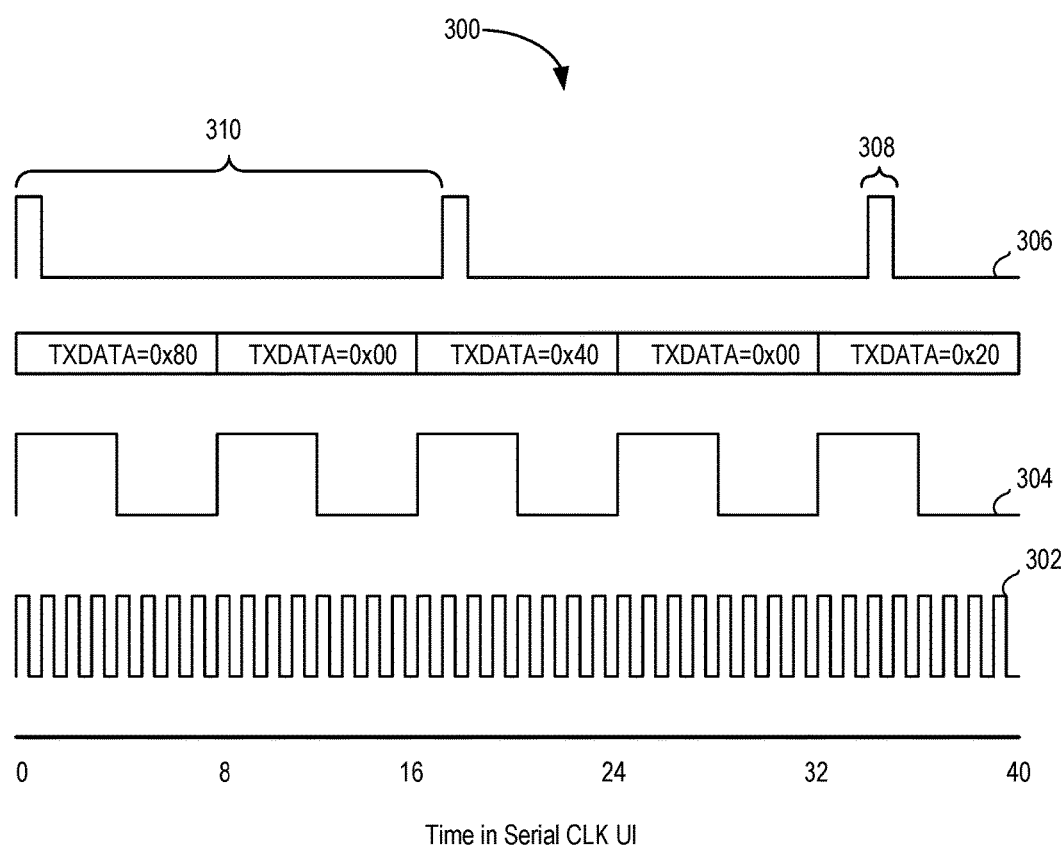
FIG. 3 shows a signal set illustrating the coarse adjustment of pulses using the parallel data word sequence according to an example.

In the example of Table 1, the parallel data word sequence is 0x80, 0x00, 0x80, 0x00, 0x40, 0x00, 0x40, 0x00, 0x20, 0x00, 0x20. While only 11 data words are shown, those skilled in the art will appreciate that the sequence can continue for more than 11 data words. This parallel data word sequence coarsely adjusts the interval between the leading pulse edges. FIG. 3 shows a signal set 300 illustrating the coarse adjustment of pulses using the parallel data word sequence according to an example. The signal set 300 includes a serial clock 302, a parallel word clock 304, and a pulse stream 306. The serial clock 302 illustrates an example of the serial clock input to the parallel-to-serial circuit 202. The parallel word clock 304 illustrates an example of the word clock input to the parallel-to-serial circuit 202. The pulse stream 306 illustrates the pulses in the serial data on the output 110 of the parallel-to-serial circuit 202. The signals are shown over a time span of 40 UI of the serial clock 302.

As shown in the example of FIG. 3, the serialization ratio is 8:1. Thus, the parallel word clock 304 is the serial clock 302 divided by 8. Each leading edge of the parallel word clock 304 clocks in a data word of the data word sequence (e.g., 0x80, 0x00, 0x40, 0x00, 0x20, etc.). A pulse in the pulse stream 306 is generated for each logic '1' in the data word sequence. In the present example, a pulse width 308 of the pulses in the pulse stream 306 is 1 UI of the serial clock 302. The data word sequence in the parallel data provides coarse control of an interval 310 between leading edges of the pulses in the pulse stream 306.

Figure 4:
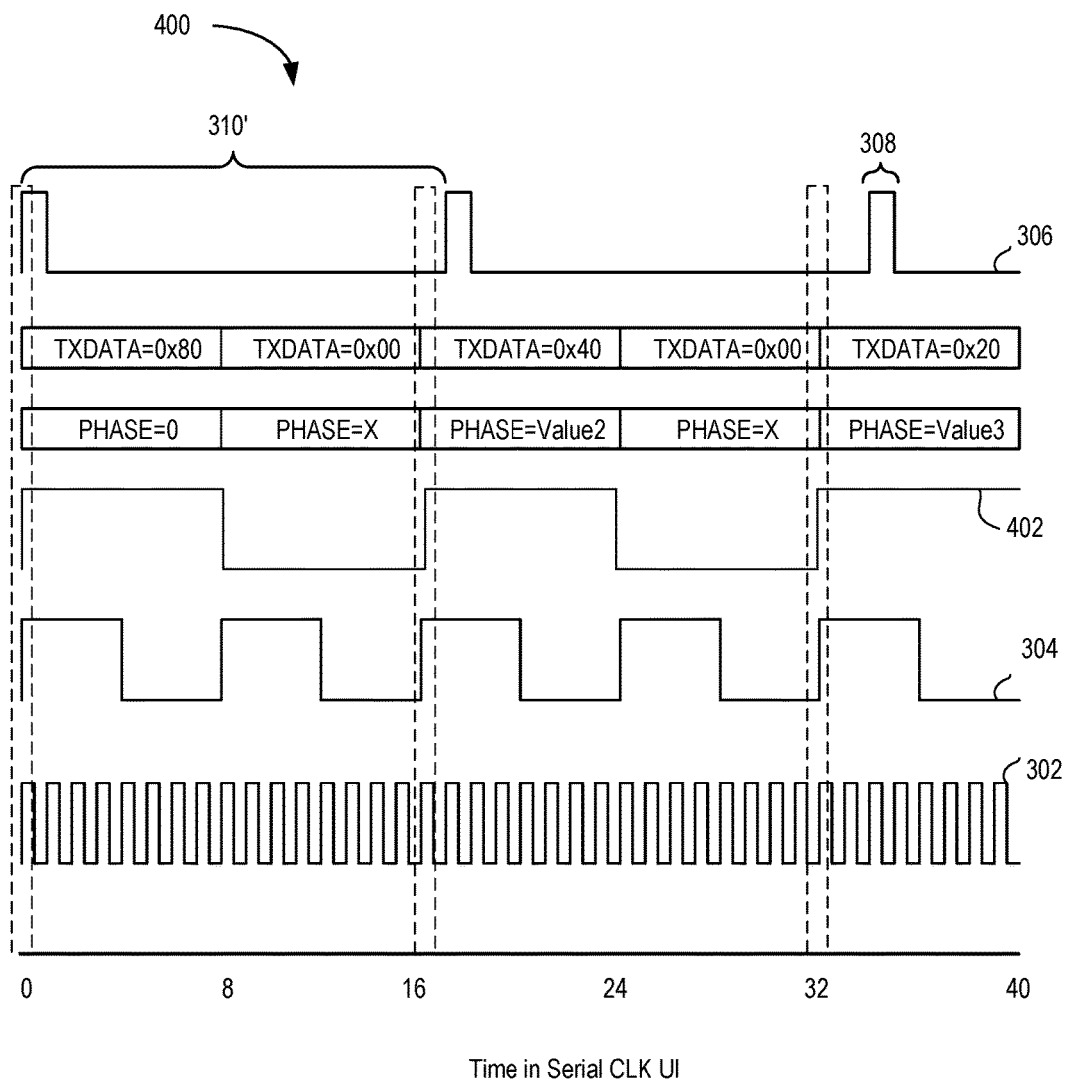
FIG. 4 shows a signal set illustrating the fine adjustment of pulses using the parallel data word sequence according to an example.

In the example of Table 1, the fine phase control sequence is no update, 30, no update, 60, no update, 25, no update, 55, no update, 21, no update. Each "no update" corresponds to the previous value of the fine phase control. While only 11 fine phase updates are shown, those skilled in the art will appreciate that the sequence can continue for more than 11 fine phase updates. This fine phase update sequence finely adjusts the interval between the leading pulse edges. FIG. 4 shows a signal set 400 illustrating the fine adjustment of pulses using the parallel data word sequence according to an example. The signal set 400 includes the serial clock 302, the parallel word clock 304, and the pulse stream 306, as well as a phase update clock 402. The signals are shown over a time span of 40 UI of the serial clock 302. In the present example, the pulse width 308 of the pulses in the pulse stream 306 is still 1 UI of the serial clock 302. However, the combination of coarse and fine control of the leading edges of the pulses in the pulse stream 306 results in an interval 310'. As shown in the example of FIG. 4, the phase update clock is the parallel word clock 304 divided by 2. That is, the fine phase updates occur every other cycle of the parallel word clock 304. The dashed boxes in FIG. 4 illustrate the timing of the fine phase control updates. The signals 302, 304, 402, the TXDATA, and the PHASE are all shifted by a fine phase (less than +/−0.5 UI) at a time shortly after any PHASE delta that occurs at the edges of the signal 402, which occurs in the example of FIG. 4 at times 16 and 32. A change in the phase of the serial clock 302 adjusts the leading edge of the next pulse in the pulse stream 306. In other examples, the fine phase updates can occur every cycle of the parallel word clock 304. In general, the fine phase control signal causes the phase interpolator 210 to adjust the phase of the clock signal to generate the serial clock signal when the parallel data is not toggling during a threshold time interval.

Table 2 shows the error in UI of the serial clock for pulse generation without fine phase control versus pulse generation with fine phase control in the example illustrated by Table 1.

TABLE 2

| Without Fine Phase Control | | With Fine Phase Control | |
| --- | --- | --- | --- |
| Position (UI) | Error (UI) | Position (UI) | Error (UI) |
| 0 | 0 | 0 | 0 |
| 16 | −0.4657 | 16.46875 | 0.00305 |
| 33 | 0.0686 | 32.9375 | 0.0061 |
| 49 | −0.3971 | 48.390625 | −0.006475 |
| 66 | 0.1372 | 64.859375 | −0.003425 |
| 82 | −0.3285 | 80.328125 | −0.000375 |

Without fine phase control, the edge resolution of the output pulses is 1 UI of the serial clock with a maximum edge position error of +/−0.5 UI of the serial clock. With fine phase control, the edge resolution of the output pulses is $1/64$ UI of the serial clock with a maximum edge position error of +/−$1/128$ UI of the serial clock (assuming the phase interpolator 210 has 64 discrete phase adjustments). Table 3 shows the edge resolution for various example serial data rates both with and without fine phase control.

TABLE 3

| Parameter | | | | | |
|---|---|---|---|---|---|
| Max data rate | 6.6 Gbps | 12.5 Gbps | 13.1 Gbps | 16.3 Gbps | 32.8 Gbps |
| Edge resolution without fine phase control | 151.52 ps | 80.00 ps | 76.34 ps | 61.35 ps | 30.53 ps |
| Edge resolution with fine phase control | 2367 fs | 1250 fs | 1193 fs | 959 fs | 477 fs |

In table 3, the units Gbps correspond to Gigabits per second, the units ps correspond to picoseconds, and the units fs correspond to femtoseconds. The pulse edge resolution is improved by 64 times when using fine phase control as compared to without fine phase control.

Various parameters described in the examples above can be modified to produce a stream of pulses having the desired characteristics. These parameters include serialization rates other than 8:1, precision edges that are trailing edges rather than leading edges, and pulse widths other than 1 UI of the serial clock. In general, a pulse stream includes a desired pulse repetition interval (PRI) and pulse width (PW) in terms of the UI of the serial clock. The serialization ratio, parallel data words, and fine phase control values can be chosen to implement a pulse stream having the desired PRI and PW.

In the examples described above, one of the pulse edges is a precision edge while the other pulse edge is a non-precision edge occurring K UI after the precision edge. In another example, the positioning of the pulse edges can be generalized to fine placement of consecutive pulse edges of opposite polarities. In such an example, the interval between edges of opposite polarities must be greater than minimums of the update interval of the phase interpolator times the quantity of the phase interpolator steps per UI divided by the maximum phase interpolator step size.

Figure 6:
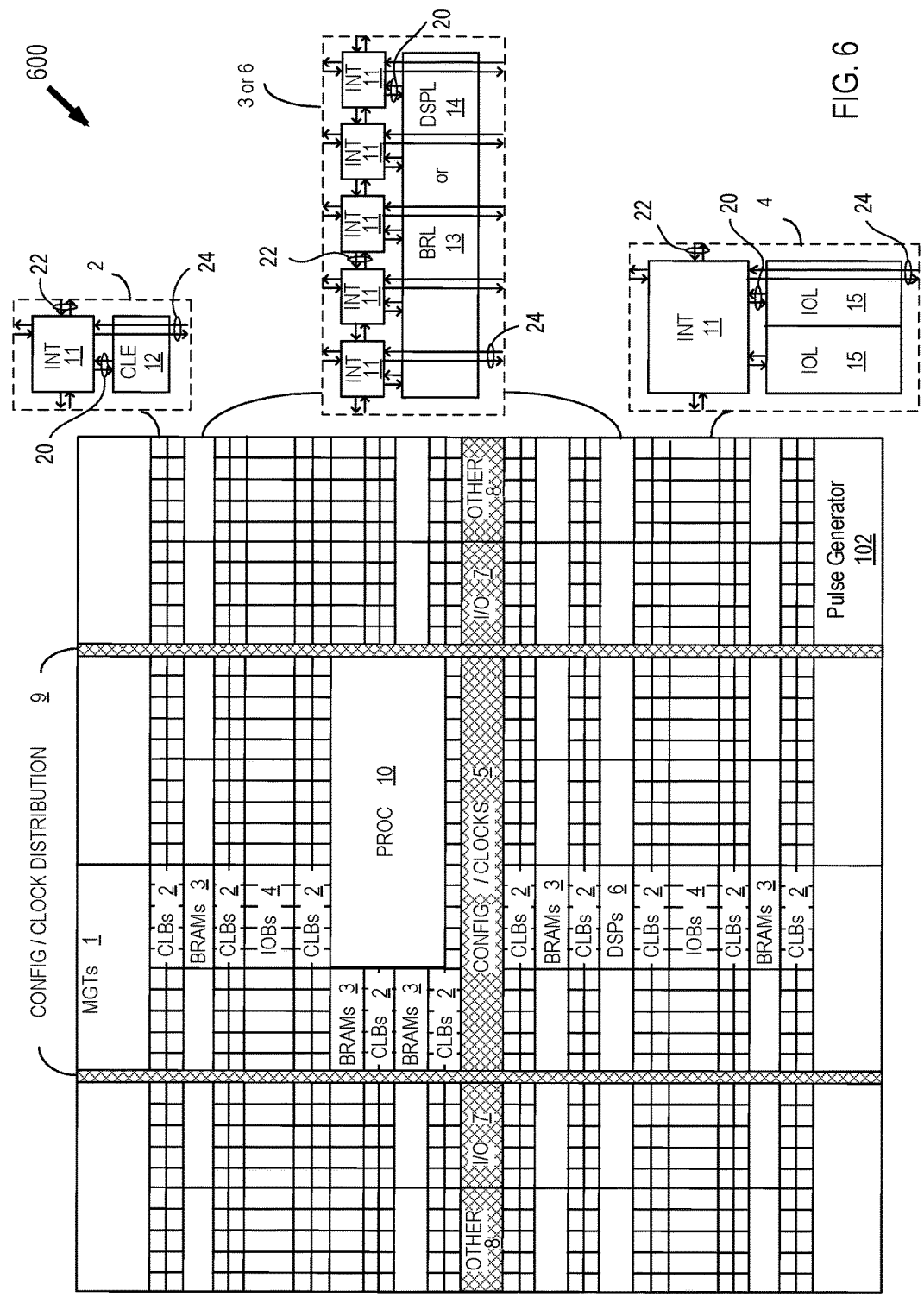
FIG. 6 illustrates an architecture of a field programmable gate array (FPGA) in which the pulse generator of FIG. 1 can be employed.

The pulse generator 102 described herein can be used in serial receivers or transceivers disposed in an IC, such as a field programmable gate array (FPGA) or other type of programmable IC. Although an FPGA is shown by way of example, it is to be understood that the pulse generator 102 can be implemented in other types of ICs or applications. FIG. 6 illustrates an architecture of an FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A pulse generation circuit, comprising:
   a parallel-to-serial circuit configured to convert parallel data to serial data according to parallel clock signal and a serial clock signal, the serial data comprises a sequence of pulses that is a serialization of the parallel data based on a serialization ratio;
   a clock generator configured to generate a clock signal; and
   a phase controller configured to generate the serial clock signal from the clock signal based on a phase control signal.

2. The pulse generation circuit of claim 1, wherein the clock generator comprises a phase-locked loop (PLL) circuit that generates the clock signal from a reference clock signal.

3. The pulse generation circuit of claim 1, further comprising:
   a divider circuit configured to generate the parallel clock signal from the serial clock signal.

4. The pulse generation circuit of claim 1, wherein the phase control signal causes the phase controller to adjust the phase of the clock signal to generate the serial clock signal when the parallel data is not toggling during a threshold time interval.

5. The pulse generation circuit of claim 1, wherein the parallel data includes at most two logic transitions per data word including between data words.

6. The pulse generation circuit of claim 1, wherein an edge resolution of the sequence of pulses is equal to a period of the serial clock divided by a number of phases per unit interval (UI) for which the phase controller can interpolate.

7. The pulse generation circuit of claim 1, wherein each pulse in the sequence of pulses includes a precision edge and a non-precision edge, the non-precision edge transitioning a fixed interval from the precision edge.

8. The pulse generation circuit of claim 7, wherein the precision edge is one of a leading edge or a trailing edge.

9. The pulse generation circuit of claim 1, wherein each pulse in the sequence of pulses includes two precision edges of opposite polarity.

10. The pulse generation circuit of claim 1, further comprising:
    a control circuit configured to generate the parallel data and the phase control signal.

11. A circuit, comprising:
    a pulse generator configured to generate pulses; and
    a pulse consumer circuit configured to consume the pulses;
    wherein the pulse generator comprises:
       a parallel-to-serial circuit configured to convert parallel data to serial data according to parallel clock signal and a serial clock signal, the serial data comprising the pulses that is a serialization of the parallel data based on a serialization ratio;
       a clock generator configured to generate a clock signal; and
       a phase controller configured to generate the serial clock signal from the clock signal based on a phase control signal.

12. The circuit of claim 11, wherein an edge resolution of the sequence of pulses is equal to a period of the serial clock divided by a number of phases per unit interval (UI) for which the phase controller can interpolate.

* * * * *